United States Patent [19]

Dathe et al.

[11] Patent Number: 4,466,839

[45] Date of Patent: Aug. 21, 1984

[54] IMPLANTATION OF AN INSULATIVE LAYER

[75] Inventors: Joachim Dathe; Walter Holtschmidt, both of Munich, Fed. Rep. of Germany

[73] Assignee: Siemens Aktiengesellschaft, Munich and Berlin, Fed. Rep. of Germany

[21] Appl. No.: 419,594

[22] Filed: Sep. 17, 1982

[30] Foreign Application Priority Data

Sep. 30, 1981 [DE] Fed. Rep. of Germany ....... 3138960

[51] Int. Cl.³ .............................................. H01L 7/00
[52] U.S. Cl. .................................. 148/1.5; 29/576 B; 204/192 D; 204/192 N; 357/91; 427/38
[58] Field of Search .................... 148/1.5; 29/576 B; 204/192 D, 192 N; 427/38; 357/91

[56] References Cited

U.S. PATENT DOCUMENTS

| | | | |
|---|---|---|---|
| 3,328,210 | 6/1967 | McCaldin et al. | 148/1.5 |
| 3,799,813 | 3/1974 | Danchenko | 148/1.5 |
| 3,818,413 | 6/1974 | Krimmel | 427/38 |
| 4,001,049 | 1/1977 | Baglin et al. | 148/1.5 |
| 4,047,974 | 9/1977 | Harari | 148/1.5 |
| 4,081,292 | 3/1978 | Aoki et al. | 148/1.5 |
| 4,162,176 | 7/1979 | Tsuda | 148/1.5 |
| 4,197,144 | 4/1980 | Kirkpatrick et al. | 148/1.5 |
| 4,258,077 | 3/1981 | Mori et al. | 427/38 |
| 4,297,782 | 11/1981 | Ito | 29/571 |
| 4,395,547 | 7/1983 | Vossen, Jr. et al. | 204/192 N |

OTHER PUBLICATIONS

Young et al., Jour. Electronic Materials, 6, (1977), 569.

*Primary Examiner*—Upendra Roy
*Attorney, Agent, or Firm*—Herbert L. Lerner; Laurence A. Greenberg

[57] ABSTRACT

Method for preparing electrically conductive layers on or in insulating layers, characterized by the feature that the conductivity of at least part of the insulating layer is increased by ion implantation.

23 Claims, 4 Drawing Figures

IMPLANTATION OF AN INSULATIVE LAYER

BACKGROUND OF THE INVENTION

1. Field of the Invention

The invention relates to a method for generating electrically conductive layers on or in an insulating layer.

2. Description of the Prior Art

The preparation of electrically conductive layers on or in insulating layers is of great importance in the manufacture of various electrical components. Thus, it is very important in semiconductor components such as integrated circuits to apply high-resistance resistors between metallic conductors or conductor-runs with little space requirements.

In addition, a shielding effect against ionogenic contamination on the surface can be obtained by applying a conductive layer on top of an insulating surface passivation, whereby, for instance, good passivation of planar semiconductor components can be achieved.

By applying a conductive layer on top of an insulating layer, the breakthrough voltage of, in particular, very shallowly diffused planar semiconductor arrangements can be increased by the provision that different electric potentials are applied to different points of the electrically conductive layer. An electrically conductive layer on an insulating layer is generated, according to German application P No. 29 44 937.4 (U.S. application Ser. No. 203,891, filed Nov. 4, 1980) by the provision that the semiconductor surface covered with an insulating layer is covered again with a semiinsulating film, for instance, by applying an amorphous silicon film. The application of a conductive film on top of an insulating film is, as was shown, of particular importance primarily in special applications in the semiconductor sector. In the choice of a method suitable for this, care should be taken to the extent possible to avoid steps which cause particularly large temperature changes in the semiconductor component, since the latter generally reduce the initial quality of the semiconductor component. It is also important, especially with respect to applying resistances in insulating layers, that the method be capable of generating these resistances with defined conductivity values. In choosing a suitable method, it is important to pay attention to the simultaneous availability of suitable and easily applicable masking methods. Finally, it is important to employ a method for the production of semiconductor components which enables one to carry out passivating procedures at the end of a manufacturing process. Further, the method should provide means for preparing and applying a conductive in such manner that it is protected against environmental influences.

SUMMARY OF THE INVENTION

It is therefore an object of the present invention to provide a method for preparing an electrically conductive layer on or in an insulating layer, which avoids high temperature steps, permits dosing of the conductivity, ensures ready and problem-less masking can be applied at the end of a semiconductor manufacturing process, and ensures that the electrically conductive layer produced is protected against environmental influences.

With the foregoing and other objects in view, there is provided in accordance with the invention a method for preparing electrically conductive layers on or in insulating layer which comprises subjecting an insulating layer to ion implantation to increase the electrical conductivity of at least part of the insulating layer.

Other features which are considered as characteristic for the invention are set forth in the appended claims.

Although the invention is illustrated and described herein as embodied in a method for the preparation of electrically conductive layers, it is nevertheless not intended to be limited to the details shown, since various modification may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings in which.

DETAILED DESCRIPTION OF THE INVENTION

Figure 1:
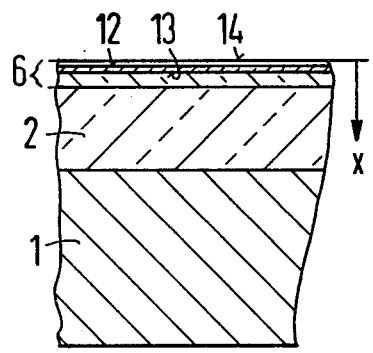
FIG. 1 diagrammatically illustrates a conducting layer shown in cross-section prepared in accordance with the invention. The substrate is a semiconductor material such as Si, Ge and GaAs. The first insulating layer is $SiO_2$. The second insulating layer may be $Al_2O_3$, $SiO_2.P_2O_5$, $SiO_2.B_2O$ or $Si_3N_4$. Beneath the surface of the second insulating layer is a layer which has conductivity by ion implantation.

In a method of the kind mentioned at the outset, the conductivity of at least part of the already existing insulating layer is increased by ion implantation.

By applying ion implantation, a temperature step is saved in an advantageous manner. In addition, a predetermined conductivity can be generated advantageously in the implanted layer, since the number of implanted ions can be dosed easily. The semiconductor surface which is not to be implanted can readily be covered by means of a photoresist mask which ensures a technically simple procedure. The implantation can be applied at the end of the semiconductor fabrication procedure, whereby an advantageous manufacturing cycle is provided. Depending on the energy of the ions used for the implantation, the conductive layer can be applied at different depths of the insulating layer, and the conductive layer in the interior of the insulating layer is at the same time protected against environment influences.

With the method according to the invention, very high resistances, for instance, between metallic conductors or conductor runs can be prepared, using little space, which is of great importance, for example, in the manufacture of integrated circuits. The method according to the invention for increasing the breakthrough voltage can be applied particularly in very shallowly diffused planar semiconductor arrangements. A conductive layer implanted into an insulating layer can be employed here in a manner similar to silicon layer according to DE-OS No. 29 44 937 deposited on an insulating layer. The method according to the invention is simpler and also more advantageous for such purposes, however, since the conductivity of the implanted layer can be set by means of the implantation dose and since such a conductive layer requires no further passivation because the applied conductive layer is sunk into the insulating layer.

In addition, a conductive layer applied according to the invention in an insulating layer brings about at the same time a passivation of the surface, since a shielding effect against ionogenic contamination on the surface is obtained by the conducting layer for the layers underneath.

It is also within the scope of the invention that the ion implantation is carried out by means of metal or semiconductor ions and, in particular, by means of silicon ions.

It is also advantageous that the implantation dose is $1 \times 10^{14}$ cm$^{-2}$ to $1 \times 10^{18}$ cm$^{-2}$, and in particular $1 \times 10^{17}$ cm$^{-2}$, and that the implantation is carried out with an acceleration voltage of 20 keV to 300 keV, and in particular about 30 keV.

It is a further advantage to use as the insulating layer, layers of at least one of the following materials: aluminum oxide ($Al_2O_3$), silicon dioxide ($SiO_2$), phosphorous glass ($SiO_2.P_2O_5$), boron glass ($SiO_2.B_2O_3$) and in particular, silicon nitride ($Si_3N_4$).

It is furthermore of advantage if the layer thickness of the upper insulating layer is 300 Å to 3000 Å and, in particular about 1000 Å, and in the implantation into the insulating layer, the Si-concentration maximum is at a distance of 0 Å to 3000 Å, particularly about 200 Å, below the outer insulating surface 14. It is also advantageous to provide annealing subsequent to the implantation and to carry out the annealing in a nitrogen or hydrogen atmosphere, and to apply in annealing, temperatures of 230° C. to 650° C. and particularly of 320° C. to 420° C. The annealing time is at least 30 minutes.

In the following, the invention is explained in greater detail with the aid of an embodiment example and the drawings.

FIG. 1 shows the substrate 1 consisting of, in particular, a semiconducting material such as silicon (Si), germanium (Ge) and gallium arsenide (GaAs). The semiconducting material is coated with a first insulating layer 2 consisting, for instance, of $SiO_2$. On top of this is deposited a second insulating layer which may consist, for instance, of aluminum oxide ($Al_2O_3$), phosphorous glass ($SiO_2.P_2O_5$), boron glass ($SiO_2.B_2O_3$) or of silicon nitride ($Si_3N_4$).

Metal or semiconductor ions, in particular silicon ions, can be used for implantation into the layer 6.

The layer 6 has a conductivity caused by the implantation in the area between the lines 12 and 13. The depth of penetration of the implanted ion is measured from the surface 14 of the insulating layer 6 in the direction of the arrow x.

For generating a silicon layer in a silicon nitride layer 6 according to FIG. 1, for instance, 1000 Å thick at an average depth of 200 Å and with a maximum concentration of approximately $5.10^{22}$ cm$^{-3}$, silicon ions are implanted with a dose of $1.10^{17}$ cm$^{-2}$, with a particle acceleration of 30 keV.

Figure 2:
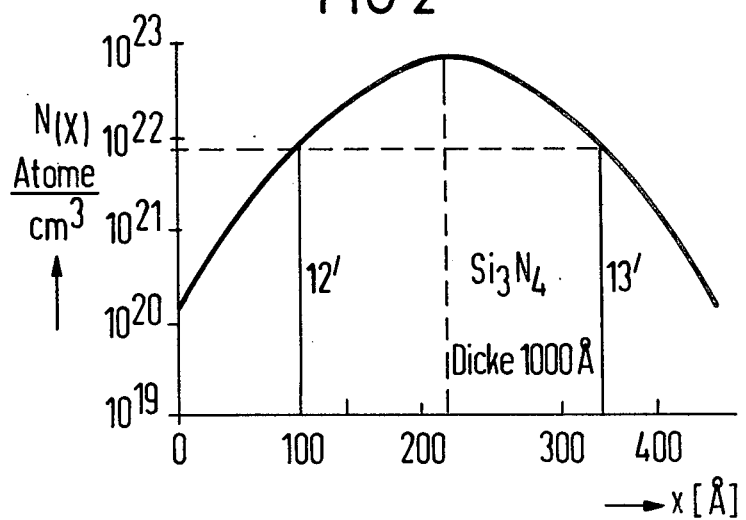
FIG. 2 shows the distribution of the implanted ions with increasing depth.

By using a smaller particle acceleration, the doping peak can be shifted closer to the surface 14. Greater particle acceleration shifts the doping peak more deeply into the interior of the layer 6. In FIG. 2, the distribution of the silicon ions in such a silicon nitride layer is shown as a function of the depth of penetration x into this layer. The maximum implantation concentration is 200 Å below the surface 14 (FIG. 1). The conductive area limited by the lines 12 and 13 in FIG. 1 is shown in FIG. 2 by the lines 12' and 13'. The silicon concentration is at least $9.10^{21}$ atoms/cm$^3$ in this area. The conductive region is at a depth of between 100 Å and 350 Å below the surface 14. By subsequent annealing of, in particular 30 minutes, at a temperature of, in particular, 320° C., the annealing of the implanted layer prepared in accordance with the invention can be increased by a factor of 10, since recrystallization takes place. For the described embodiment example, a value of $10^7$ ohm cm is obtained for the implanted insulating layer prepared in accordance with the invention. The current flow through an implanted insulating layer prepared in accordance with the invention exhibits ohmic behaviour in the entire voltage range.

Figure 3:
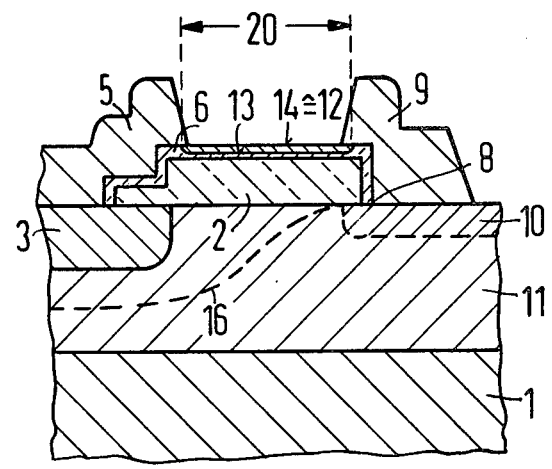
FIG. 3 illustrates one application by showing a cross section through part of a semiconductor component with an Si-layer implanted in accordance with the invention in the second insulating layer in order to increase the breakthrough voltage of the pn-junction.

FIG. 3 shows a cross section through part of the semiconductor component with an Si-layer implanted in accordance with the invention in the second insulating layer 6, in order to increase the breakthrough voltage of the pn-junction. On the substrate 1, for instance, of semiconductor material, and particularly of silicon, there is a, for instance, n-doped silicon layer 11, into which a p-doped region 3 and an n+-doped region 10 are placed. On the surface 8 of the layer 11 a first insulating layer 2 and on top of it, a second insulating layer 6 are applied. The second insulating layer 6 may consist, for instance, of aluminum oxide ($Al_2O_3$), phosphorous glass ($SiO_2.P_2O_5$), boron glass ($SiO_2.B_2O_3$) or, in particular, silicon nitride ($Si_3N_4$). The first insulating layer 1 consists of silicon dioxide ($SiO_2$). For connecting the p-doped area 3 and the n+-doped region 10, window openings are made in the two insulating layers by means of a photo technique which extend up to the semiconductor surface 8. By subsequent deposition of contact material, for instance, aluminum, and a further photo technique for forming the specific contact pattern, the contacts 5 and 9 are generated, while the second insulator layer 6 is free of contact material in the region 20. Subsequent implantation of the entire surface, for instance, by means of silicon and, for instance, by means of the parameters described in FIG. 2 generates in the vicinity of 20 of the second insulating layer 6 a conductive layer which, after annealing for 30 minutes at 320° C., has a resistance of approximately $10^7$ ohm.cm. The contacts 5 and 9 are connected by this layer through the high-resistance resistor. If the contacts 5 and 9 are at different potentials, for instance, if contact 5 is the base terminal of a transistor and contact 9 a lead for a channel stopper, the space charge zone is given in the interior of the n-doped silicon layer 11, a shape indicated by a dashed curve 16, which is distinguished by very large radii of curvature, so that a semiconductor component prepared by means of the method according to the invention has a high breakthrough voltage.

Figure 4:
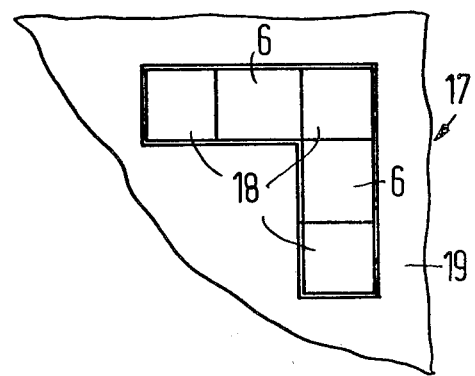
FIG. 4 illustrates another application by showing a plan view of part of a semiconductor chip which has contact spots of aluminum which belongs to special terminals of an integrated circuit.

FIG. 4 shows a top view onto part of a semiconductor chip 17 which has contact spots 18 consisting, for instance, of aluminum which belong, for instance, to special terminals of an integrated circuit. Si-zones implanted in insulating regions 6 between the contact spots 18, are placed as high-resistance resistors (for instance, attenuation resistors). For applying such high-resistance resistors, the entire semiconductor surface, with the exception of those zones which are to be provided with high-resistance resistors as well as the terminal zone in the contact spots 18, is masked by means of a photoresist mask 19. Thereupon, implantation of a semiconductor chip 17 can be performed over the entire surface, for instance, with silicon ions and, for instance, by means of the parameters given in connection with FIG. 2.

The invention is not limited to the embodiment examples shown as well as to the materials and dopings mentioned.

We claim:

1. Method for fabricating semiconductor components in which the semiconductor body of the semiconductor component is at least partially covered with a layer of inorganic insulation to generate an electrically conductive layer between two spaced metal contacts in contact with the insulating layer, which comprises subjecting the insulating layer to ion implantation to implant an electrically conductive layer within the inorganic insulation remote from the surface of the semiconductor body beneath the inorganic insulation, and extending the ion implantation over an area of the inorganic insulation to cause the electrically conductive layer to contact said two spaced metal contacts.

2. Method according to claim 1, wherein the electrically conductive layer is at the top surface of the insulating layer.

3. Method according to claim 1, wherein the semiconductor component is covered with two layers of insulation with the outer layer of insulation furthest from the surface of the semiconductor component being a layer of inorganic insulation on which is generated the electrically conductive layer between two spaced metal contacts.

4. Method according to claim 1, wherein the ion implantation is carried out by means of ions selected from the group consisting of metal ions and semiconductor ions.

5. Method according to claim 1, wherein the ion implantation is carried out by means of silicon ions.

6. Method according to claim 1, wherein the ion implantation is carried out with an implantation dose of from $1 \times 10^{14}$ cm$^{-2}$ to $1.10^{18}$ cm$^{-2}$.

7. Method according to claim 1, wherein the insulating layer is silicon nitride ($Si_3N_4$).

8. Method according to claim 1, wherein the insulating layer is annealed subsequent to the ion implantation.

9. Method according to claim 3, wherein said two layers of insulation have different chemical compositions.

10. Method according to claim 3, wherein the outer insulating layer is a material selected from the group consisting of aluminum oxide ($Al_2O_3$), phosphorous glass ($SiO_2.P_2O_5$), boron glass ($SiO_2.B_2O_3$) and silicon nitride ($Si_3N_4$).

11. Method according to claim 3, wherein the outer insulating layer is silicon nitride ($Si_3N_4$).

12. Method according to claim 11, wherein the inner insulating layer between the outer insulating layer and the surface of the semiconductor component is silicon dioxide ($SiO_2$).

13. Method according to claim 6, wherein the implantation dose is about $1.10^{17}$ cm$^{-2}$.

14. Method according to claim 5, wherein the ion implantation is carried out with an implantation dose of from $1 \times 10^{14}$ cm$^{-2}$ to $1.10^{18}$ cm$^{-2}$.

15. Method according to claim 14, wherein the implantation dose is about $1.10^{17}$ cm$^{-2}$.

16. Method according to claim 1 or 14, wherein the ion implantation is carried out with an accelerating voltage of about 30 keV.

17. Method according to claims 1, 5, 6, or 14, wherein the insulating layer is a material selected from the group consisting of aluminum oxide ($Al_2O_3$), silicon dioxide ($SiO_2$), phosphorous glass ($SiO_2.P_2O_5$), boron glass ($SiO_2.B_2O_3$) and silicon nitride ($Si_3N_4$).

18. Method according to claim 1 or 14, wherein the layer thickness of the insulating layer is about 300 Å to 3000 Å.

19. Method according to claim 1 or 14, wherein the layer thickness of the insulating layer is about 1000 Å.

20. Method according to 1, 3, or 14, wherein the ion implantation of the insulating layer is carried out to produce a maximum dose at a distance of about 200 Å below the outer insulating surface.

21. Method according to claim 8, wherein the annealing is carried out in an atmosphere selected from the group consisting of nitrogen and hydrogen atmosphere.

22. Method according to claim 8, wherein the annealing is carried out at temperatures of 320° C. to 650° C.

23. Method according to claim 8, wherein the annealing is carried out at temperatures of 320° C. to 420° C.

* * * * *